US009632883B2

(12) United States Patent
Masleid et al.

(10) Patent No.: US 9,632,883 B2
(45) Date of Patent: Apr. 25, 2017

(54) DIGITAL ENCODING OF PARALLEL BUSSES TO SUPPRESS SIMULTANEOUS SWITCHING OUTPUT NOISE

(71) Applicant: Oracle International Corporation, Redwood City, CA (US)

(72) Inventors: Robert P. Masleid, Monte Sereno, CA (US); Don Draper, San Jose, CA (US); Venkat Krishnaswamy, Los Altos, CA (US); Paul Loewenstein, Palo Alto, CA (US)

(73) Assignee: Oracle International Corporation, Redwood Shores, CA (US)

( * ) Notice: Subject to any disclaimer, the term of this patent is extended or adjusted under 35 U.S.C. 154(b) by 81 days.

(21) Appl. No.: 14/563,485

(22) Filed: Dec. 8, 2014

(65) Prior Publication Data
US 2016/0164539 A1   Jun. 9, 2016

(51) Int. Cl.
| H03M 13/03 | (2006.01) |
| G06F 11/16 | (2006.01) |
| H03M 5/00 | (2006.01) |
| H03M 13/09 | (2006.01) |
| H03M 7/00 | (2006.01) |

(52) U.S. Cl.
CPC ......... G06F 11/1625 (2013.01); *H03M 5/00* (2013.01); *H03M 7/00* (2013.01); *H03M 13/09* (2013.01)

(58) Field of Classification Search
CPC .................. G06F 11/1625; H03M 13/21
See application file for complete search history.

(56) References Cited

U.S. PATENT DOCUMENTS

| 5,142,167 A | 8/1992 | Temple et al. |
| 6,624,764 B2 | 9/2003 | Wei |
| 8,752,097 B2 * | 6/2014 | Johnston ............ H04N 7/17318 725/62 |
| 8,824,598 B2 * | 9/2014 | Dimou .................. H04L 1/0014 370/335 |
| 8,938,376 B2 | 1/2015 | Hollis |
| 2005/0002326 A1 * | 1/2005 | Ling .................... H04B 7/0417 370/208 |
| 2009/0168575 A1 | 7/2009 | Messier |

(Continued)

OTHER PUBLICATIONS

Slepian; "Permutation Modulation"; Proceedings of the IEEE; vol. 53, Issue: 3; 228-236; Mar. 1965.

*Primary Examiner* — M. Mujtaba Chaudry
(74) *Attorney, Agent, or Firm* — Meyertons, Hood, Kivlin, Kowert & Goetzel, P.C.

(57) ABSTRACT

An apparatus and method for encoding data are disclosed that may allow for different encoding levels of transmitted data. The apparatus may include an encoder unit and a plurality of transceiver units. The encoder unit may be configured to receive a plurality of data words, where each data word includes N data bits, wherein N is a positive integer greater than one, and encode a first data word of the plurality of data words. The encoded first data word may include M data bits, where M is a positive integer greater than N. Each transceiver unit may transmit a respective data bit of the encoded first data word. The encoder unit may be further configured to receive information indicative of a quality of transmission of the encoded first data word, and encode a second data word of the plurality of data words dependent upon the quality.

20 Claims, 10 Drawing Sheets

(56) References Cited

U.S. PATENT DOCUMENTS

| | | | |
|---|---|---|---|
| 2010/0098047 A1* | 4/2010 | Zhou | H04L 47/10 370/345 |
| 2010/0124275 A1* | 5/2010 | Yeh | H04N 21/44209 375/240.07 |
| 2014/0010322 A1* | 1/2014 | Oyman | H04L 1/0019 375/267 |
| 2014/0169500 A1* | 6/2014 | Dimou | H04L 1/0014 375/316 |
| 2014/0192847 A1* | 7/2014 | Afkhami | H04L 27/2649 375/219 |
| 2014/0198837 A1 | 7/2014 | Fox et al. | |

* cited by examiner

DIGITAL ENCODING OF PARALLEL BUSSES TO SUPPRESS SIMULTANEOUS SWITCHING OUTPUT NOISE

BACKGROUND

Technical Field

Embodiments described herein are related to the field of high-speed interface design, and more particularly to AC coupling techniques.

Description of the Related Art

Computing systems typically include a number of interconnected integrated circuits. In some cases, the integrated circuits may communicate through parallel interfaces, which simultaneously communicate multiple bits of data. In other cases, the integrated circuits may employ a serial interface, which sequentially communicates one bit of data at a time. In some cases, both parallel and serial interfaces, individual bits of communicated data may be differentially encoded.

In a computing system, the integrated circuits may have different power supply requirements, which may result in different output voltages being coupled to the integrated circuits' respective communication ports. Furthermore, variations in the properties of wiring traces on circuit boards as well as differences in power supply performance, may further contribute to differences in the power supply voltages supplied to the integrated circuits. Switching of output circuits during the transmission of data from one integrated circuit to another may further contribute to variations in the voltage levels of the power supplies.

To ensure overall system performance, additional margin may be added into the design to compensate for the variation in power supply voltage levels. In some cases, additional area and power may be consumed to ensure that sub-circuits within an integrated circuit can perform at level better than specified. By designing circuits in such a fashion, operation during periods of variation in power supply voltage levels may be maintained.

SUMMARY OF THE EMBODIMENTS

Various embodiments of an apparatus to encode data are disclosed. Broadly speaking, a system and method are contemplated that includes an encoder unit and a plurality of transceiver units. The encoder unit may be configured to receive a plurality of data words, where each data word includes N data bits, where N is a positive integer greater than one, and encode a first data word where the first encoded data word includes M data bits, where M is a positive integer greater than N. Each transceiver unit may then transmit a respective data bit of the first encoded data word. The encoder unit may be further configured to receive information indicative of a quality of the transmission of the first data word, and encode a second data word, where the second encoded data word include P data bits, where P is a positive integer greater than one and different than M.

In one embodiment, the encoder may be further configured to select a value of P that is less than a value of M. The selection may be in response to a determination that the quality of the transmission of the first data word is greater than a predetermined level.

In another specific embodiment, the encoder may be further configured to select a value of P that is greater than a value of M. The selection may be in response to a determination that the quality of transmission of the first data word is less than a predetermined level.

BRIEF DESCRIPTION OF THE DRAWINGS

The following detailed description makes reference to the accompanying drawings, which are now briefly described.

Figure 1:
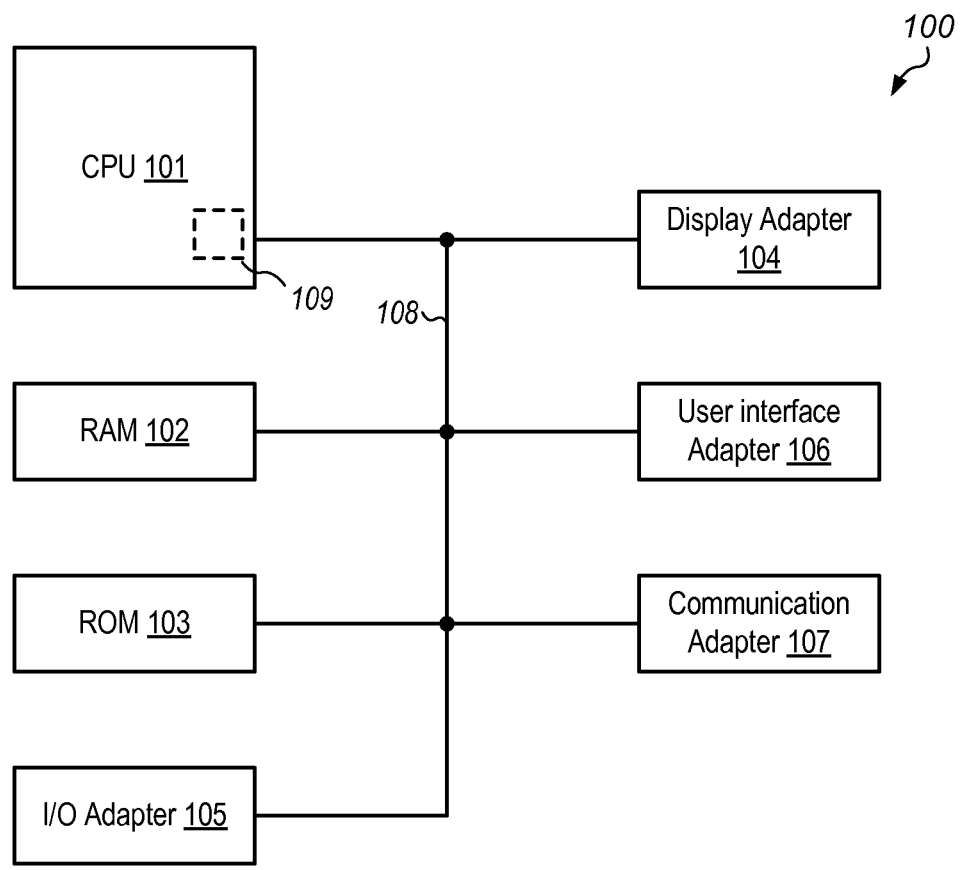
FIG. 1 illustrates an embodiment of a computing system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

A computing system may include one or more integrated circuits, such as, e.g., a central processing unit (CPU) and memories. Each one of the integrated circuits of the computing system may communicate through either a serial or parallel interface. In a parallel interface, multiple data bits are communicated simultaneously, while in a serial interface, data is communicated as a series of sequential single data bits. The data may be communicated in accordance to one of various communication protocols.

Data communicated between integrated circuits of the computing system may be transmitted over a collection of wires (also referred to herein as a "bus"). In order to change the logic state of a wire on the bus, charge may be applied to the wire, or charge may be removed, i.e., discharged from the wire. In the case of a parallel interface between integrated circuits, multiple wires may be charged or discharged in parallel, commonly referred to as "simultaneous switching."

Simultaneous switching during data transmission may result in higher power consumption within a computing system in addition to power supply and ground noise. In some cases, sub-circuits within the integrated circuits of the computing system may be designed with additional margin to combat reductions in performance resulting from power supply and ground noise. To mitigate the effects of the simultaneous switching of outputs, data may be encoded prior to transmission such that fewer transitions occur from one encoded data word to another.

Changes to environmental and operational parameters, may affect a noise level a computing system may tolerate. As a result, a fixed encoding scheme may be insufficient under certain combinations of environmental and operational parameters, resulting in transmission errors. The embodiments illustrated in the drawings and described herein may provide techniques for adjusting an encoding scheme responsive to changes in tolerance to noise levels in a computing system, thereby providing a method to encode and transmit data within a given noise tolerance level.

Computing System Overview

A block diagram of a computing system is illustrated in FIG. 1. In the illustrated embodiment, the computing system 100 includes a CPU 101 coupled to Random Access Memory (RAM) 102, Read-only Memory (ROM) 103, and display adapter 104. CPU 101 is additionally coupled to input/output (I/O) adapter 105, user interface adapter 106, and communications adapter 107. In various embodiments, computing system 100 may be configured as a desktop system, a laptop system, or in any suitable form factor.

RAM 102 may include any suitable type of memory, such as Fully Buffered Dual Inline Memory Module (FB-DIMM), Double Data Rate or Double Data Rate 2 Synchronous Dynamic Random Access Memory (DDR/DDR2 SDRAM), or Rambus® DRAM (RDRAM®), for example. It is noted that although one RAM is shown, in various embodiments, any suitable number of RAMs may be employed.

CPU 101 may implement any suitable instruction set architecture (ISA), such as, e.g., the SPARC™, PowerPC™, or x86 ISAs, or combination thereof. In some embodiments, CPU 101 may include one or more processor cores configured to implement one of the aforementioned ISAs. CPU 101 may also include one or more cache memories which may be configured to store instructions and/or data during operation. In other embodiments, CPU 101 may include power management unit 110 which may be configured to process and manage requests for changes in the power status of system 100. For example, power management unit 110 may respond to a system request for entry into sleep mode by generating a sleep mode signal that may cause portions of CPU 101, such as bus transceiver unit 109, for example, to power down. In some embodiments, power management unit 110 may coordinate the orderly power up of CPU 101 by generating one or more power up signals each of which may activate a different portion of the circuits within CPU 101.

CPU 101 may include one or more bus transceiver units 109 that allow CPU 101 to connect to bus 108. In some embodiments, bus 108 may be a high-speed serial interface that may conform to an industry standard specification, such as, e.g., PCI Express™, or MIPI Physical Layer. In some embodiments, the various circuits block, such as, e.g., CPU 101, may be coupled to bus 108 through a capacitor (this is commonly referred to as being "AC coupled").

ROM 103 may be configured to store instructions to be executed by CPU 101. In some embodiments, ROM 103 may store instructions necessary for initial boot-up and configuration of CPU 101. The stored instructions may include, in some embodiments, instructions to perform a power-on self-test (POST) that may allow CPU 101 to test embedded cache memories and other circuit blocks that may reside on CPU 101. In some embodiments, ROM 103 may be mask-programmable using a metal, polysilicon, contact, implant, or any suitable mask layer available on a semiconductor manufacturing process.

I/O adapter 105 may be configured to coordinate data transfer between CPU 101 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, I/O adapter 105 may be configured to implement a version of Universal Serial Bus (USB) protocol or IEEE 1394 (Firewire®) protocol.

Communication adapter 107 may be configured to coordinate data transfer between CPU 101 and one or more devices (e.g., other computer systems) coupled to CPU 101 via a network. In one embodiment, communication adapter 107 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, communication adapter 107 may be configured to implement multiple discrete network interface ports.

User interface adapter 106 may be configured to transfer data between one or more peripheral devices configured to input data into computing system 100. In one embodiment, user interface adapter 106 may receive input from a keyboard and transfer the data to CPU 101. In other embodiments, user interface adapter 106 may receive and format data from a mouse or other suitable pointing device.

Display adapter 104 may be configured to transfer and format data from between CPU 101 and a display screen. In some embodiments, display adapter 104 may be configured to implement a display standard such as Super-VGA or High-Definition Multimedia Interface (HDMI). In other embodiments, display adapter 104 may be configured to implement multiple display interfaces.

The embodiment illustrated in FIG. 1 is merely an example. In other embodiments, different types and numbers of devices are possible and contemplated.

Figure 2:
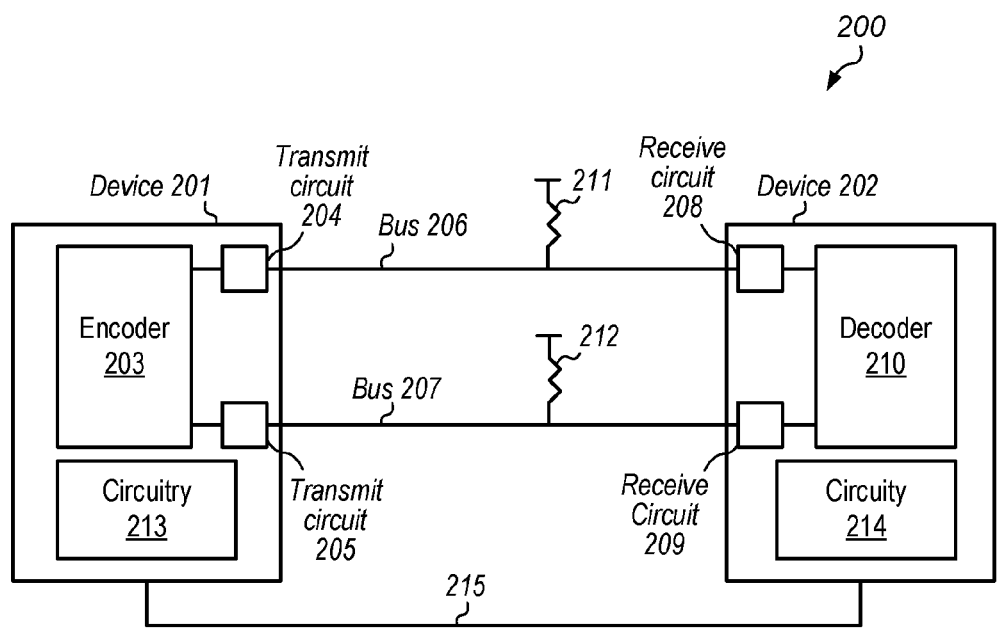
FIG. 2 illustrates another embodiment of a computing system.

Turning to FIG. 2, another embodiment of computing system is illustrated. In the illustrated embodiments, computing system 200 includes device 201 coupled bus 206 and bus 207, which are, in turn, coupled to device 202. Termination devices 211 and 212 are coupled to bus 206 and 207, respectively. In various embodiments, devices 201 and 202 may correspond to any of the functional blocks described above in referenced to computing system 100 as illustrated in FIG. 1.

Bus 206 and bus 207 may, in various embodiments, include multiple conductive traces on a circuit board, substrate, or any other material suitable for the implementation of a computing system, such as computing system 200, for example. In some embodiments, traces at a constant electrical potential may be inserted between the individual traces included in bus 206 and bus 207. Such traces (commonly referred to as "shields") may, in various embodiments, reduce capacitive and inductive coupling between the individual traces of bus 206 and bus 207, thereby improving the integrity of the signals transmitted on busses 206 and 207. Dependent upon a type of data encoding used, a subset of the available multiple conductive traces may be used at a given time. Unused traces may, in some embodiments, may be set to a predetermined voltage level, such as, a ground level, for example. In other embodiments, data may be transmitted such that unused traces are interspersed between active traces, thereby providing a shielding effect.

Device 201 includes encoder 203, which is coupled to transmit circuits 204 and 205, which are, in turn, coupled to bus 206 and bus 207, respectively. In some embodiments, encoder 203 may be configured to encode data to be transmitted to device 202 via bus 206 and bus 207. The data may be encoded by one of various encoding methods such as, e.g., bit inversion, or any other suitable encoding method. Encoder 203 may also generate an error correction code for the data. The error correction code may be generated prior to encoding, or may be generated using the encoded data, and may include a Cyclic Redundancy Check (CRC) or any other suitable error checking code. Encoder 203 may be designed in accordance with one of numerous design styles. For example, encoder 203 may be a general-purpose processor executing program instructions stored in a memory, a dedicated logic circuit, a memory circuit configured to perform as a look-up table, or any other suitable circuit configured to encode data.

Device 201 also includes circuitry 213. In various embodiments, circuitry 213 may receive information via wire 215 indicating a quality level associated with transmission of encoded data on bus 206 and bus 207. Depending on the quality level, circuitry 213 may signal encoder 203 to modify an encoding scheme, or select a different encoding scheme based on a number of available encoding schemes. In various embodiments, circuitry 213 may also generate or store test data that may be encoded by encoder 203 and transmitted to device 202 via busses 206 and 207.

Circuitry 213 may be designed in accordance with one of various design styles. In some embodiments, circuitry 213 may include a dedicated state machine or other sequential logic. Circuitry 213 may, in other embodiments, include a general purpose processor configured to execute program instructions stored in one or more memories included in circuitry 213.

Transmit circuits 204 and 205 may be configured to translate voltage levels of the encoded data for transmission on bus 206 and bus 207, respectively. For example, transmit circuit 204 and 205 may each be configured to transmit data in accordance with the Low-Voltage Transistor-Transistor Logic (LVTTL) standard, or any other suitable voltage levels suitable for signaling from one device to another.

Termination devices 211 and 212 may, in various embodiments, be configured to match the impedance of bus 206 and 207 to the input impedance of receive circuits 208 and 209, respectively. It is noted that although termination devices 211 and 212 are depicted as resistors coupled to a power supply, in other embodiments, termination devices 211 and 212 may include resistors coupled to ground, combinations of resistors, capacitors, and inductors, or any other suitable collection of active or passive circuits elements capable of matching the aforementioned impedances.

Device 202 includes receive circuits 208 and 209 which are coupled to bus 206 and 207, respectively. Receive circuits 208 and 209 are further coupled to decoder 210. Receive circuit 208 and 209 may be configured to translate voltage levels on bus 206 and bus 207, respectively, to a voltage levels used by decoder 210. For example, receive circuits 208 and 209 may translate LVTTL voltage levels to Complementary Metal-Oxide Semiconductor (CMOS) voltage levels.

Decoder 210 may be configured to decode the encoded data received by receive circuits 208 and 209, thereby translating the received encoded data into a format that may be used by device 202. Decoder 210 may also analyze an error checking code such as, e.g., a CRC code, generated by encoder 203, to determine if errors were introduced during the transmission of the data via busses 206 and 207. In some embodiments, decoder 210 may signal to other logic circuits (not shown) within device 202 that the received data contains errors. Decoder 210 may, in other embodiments, attempt to correct the errors in cases where a sending device includes an Error Correction Code (ECC).

In some embodiments, decoder 210 may be designed in accordance with one of numerous design styles. For example, decoder 210 may be a general-purpose processor executing instructions stored in a memory, dedicated logic circuit, a memory device configured to perform as a look-up table, or any other suitable circuit for decoding the received encoded data.

It is noted that the embodiment of a computing system illustrated in FIG. 2 is merely an example. In other embodiments, different numbers of busses coupling different numbers of devices may be employed.

Simultaneously Switching Outputs

Data sent between integrated circuit may include multiple words (also referred to as "symbols") that include multiple data bits. When such data is transmitted between integrated circuits using a communication bus, such as, e.g., bus 206 as illustrated in FIG. 2, the individual bits included in the symbol may change from a high logic level to a low logic level or vice versa. The transition of multiple data bits from a low logic level to a high logic level may be referred to as Simultaneously Switching Outputs (SSO). It is noted that in some embodiments, a low or low logic level refers to a voltage level at or near ground potential, and a high or high logic levels refers to a voltage sufficiently large to turn on an n-channel Metal-Oxide Semiconductor Field-Effect Transistor (MOSFET) and turn off a p-channel MOSFET. In other embodiments, different technologies may result in different voltage levels for high and low logic levels.

Figure 3:
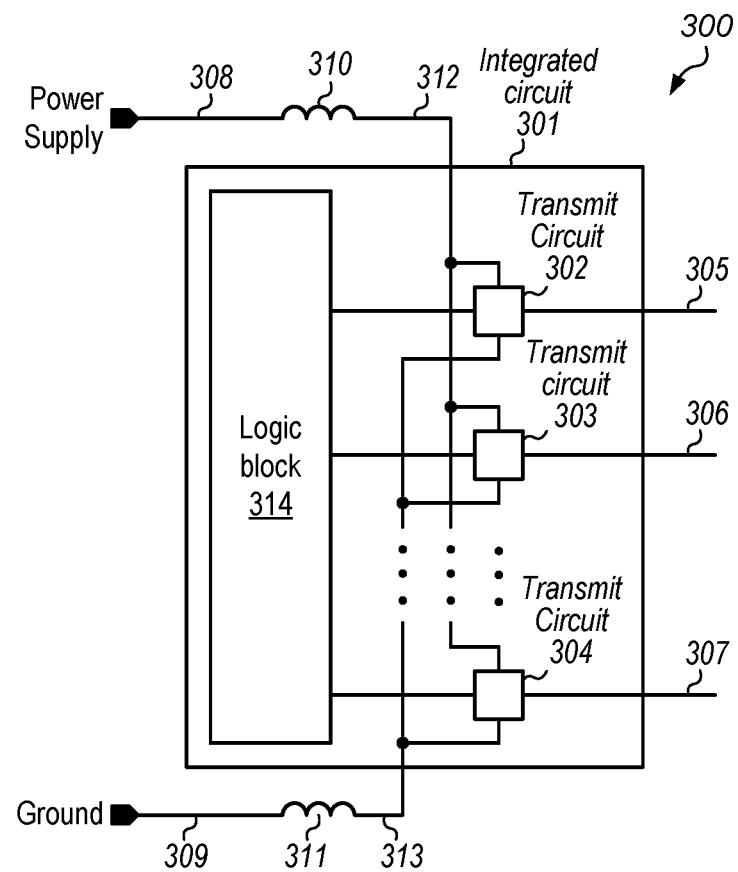
FIG. 3 illustrates an embodiment of an integrated circuit.

An embodiment of integrated circuit power supply system is illustrated in FIG. 3. In the illustrated embodiment, system 300 includes integrated circuit 301, which is coupled to power supply 308 through inductor 310. Integrated circuit 301 is further coupled to ground supply 309 through inductor 311. In various embodiments, inductors 310 and 311 may represent parasitic inductances of integrated circuit packages, power supply traces on a circuit board, and the like. Integrated circuit 301 may, in various embodiments, correspond to device 201 of computing system 200 as illustrated in FIG. 2.

Integrated circuit 301 includes logic block 314 coupled to transmit circuits 302 through 304, which are, in turn, coupled to wires 305 through 307, respectively. In some embodiments, wires 305 through 307 may be part of a communication bus, such as, e.g., bus 206 as depicted in FIG. 2, and transmit circuits 302 through 304 may collectively correspond to one of transmit circuits 204 or 205 of device 201 as illustrated in FIG. 2. Each of transmit circuits 302 through 304 may be configured to translate voltage levels internal to integrated circuit 301 to voltage levels necessary for transmission of the data bits on wires 305 through 307.

Logic block 314 may perform one of various functions. For example, logic block 312 may be a general-purpose processor configured to execute program instructions stored in a memory. In other embodiments, logic block 312 may be a memory or a dedicated state-machine logic circuit. Logic block 312 may, in various embodiments, perform encoding of data to be transmitted off-chip via wires 305 through 307.

During operation, when one of transmit circuits 302 through 304 charges a respective wire of wires 305 through 307 from a low logic level to a high logic level, current is drawn from power supply 308. As the current moves through inductor 310, a voltage may develop across inductor 310, which may result in the voltage level of internal power supply 312 to be less than the voltage level of power supply 308. In some embodiments, the drop on the voltage level of internal power supply 312 may increase when more transmit circuits are required to charge their respective wires to from a low logic level to a high logic level.

A similar result occurs when one of transmit circuits 302 through 304 discharges its respective wire to change the logic level on the wire from a high logic level to a low logic level. The current is steered into ground 309 through inductor 311. As described above, a voltage drop develops across inductor 311 which causes the voltage level of internal ground 313 to rise above the voltage level of ground 309, i.e., ground potential.

Variations in the voltage levels of internal supplies 312 and 313 may, in various embodiments, result in changes in operational or performance parameters of circuits within integrated circuit 301. A lower voltage level on internal power supply 312 may result in circuits within integrated circuit 301 to operate more slowly, which may prevent operation at an intended clock frequency. A higher voltage level on ground 313 may shift the reference level for outgoing signals on wires 305 through 307, which may, in turn, result in the misinterpretation of the logic levels of data bits when they are received at the far-end of wires 305 through 307. In some embodiments, circuits may be designed to provide additional margin in the overall system design in order to compensate for the aforementioned variation in the voltage levels of the internal power supplies. Such circuits may, in various embodiments, have a higher power consumption, be physically larger, and may result in lower manufacturing yield.

It is noted that the embodiment illustrated in FIG. 3 is merely an example. In other embodiments, different numbers of output drivers and different parasitic circuit elements may be possible.

Symbol Encoding and Decoding

In some embodiments, symbols to be transmitted are encoded, i.e., mapped from their native symbol space, to an alternative symbol space, in order to reduce the number of data bits within a symbol that must transition from a low logic level to a high logic level. When such a mapping is performed, it may, in various embodiments, reduce noise generated by SSO. For example, in various embodiments, a technique referred to as Bit Inversion (BI) may be employed.

Figure 4:
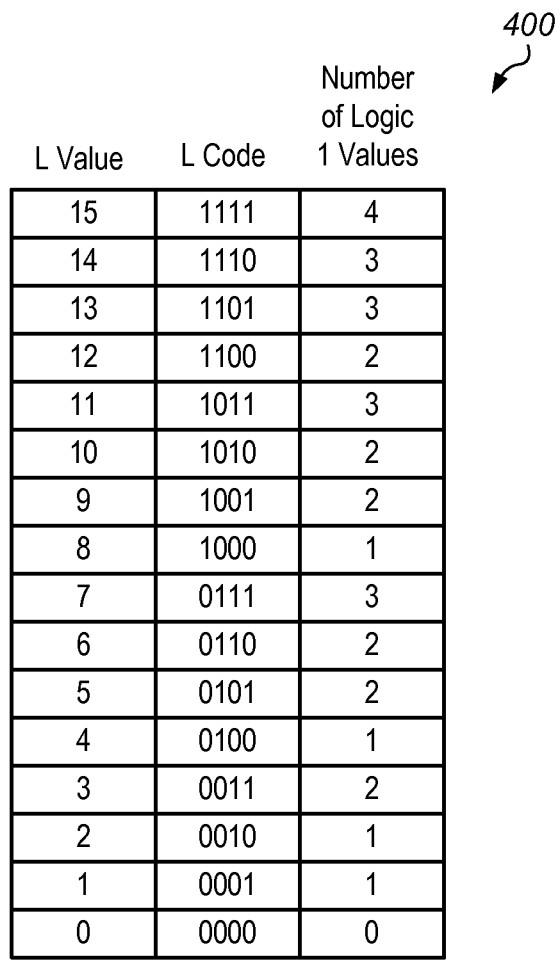
FIG. 4 illustrates a table of logic values and code words.

Turning to FIG. 4, a table illustrating the possible symbols for using four data bits is illustrated. In the first column of the table, the numeric (or "L value") of a given number is listed, and the in the second column of the table, the equivalent 4 data bit logical symbol (or "L-code") is listed. In the third column of the table, the number of high logic levels (or "logic 1 values") for each corresponding L-code is listed (commonly referred to as the "Hamming weight"). For example, the L-code value of "1111" (L value "1") contains four logic 1 values, while the L-code value of "0001" (L value "1") contains a single logic 1 value.

The symbols illustrated in FIG. 4 may be used to transmit numbers, i.e., numbers zero through fifteen, over a four data bit wide bus. As one number is transmitted after another, the change in Hamming weight of the corresponding symbols, determines how may output driver circuits of a integrated circuit, such as, e.g., device 201 as illustrated in FIG. 2, must charge or discharge a wire and corresponding load. For example, if the L-code symbol "0000" was transmitted, following the L-code symbol "1111," all four data bits must transition from a low logic level to a high logic level, thereby creating a high SSO situation. However, in the transition from transmitting L-code symbol "0011" to L-code symbol "1001," there is no SSO noise (also referred to herein as a being "silent") as the number of logic 1 values and the number of logic 0 values remains the same. In other words, the logic 1 values merely rearrange themselves within the 4 data bit wide space. In some embodiments, the use of symbols that contain an equal number of logic 1 values and logic 0 values may result in silent transmission of data from one integrated circuit to another. Symbols that result in little or no SSO generated noise may be referred to as "silent" or "S-code" symbols. While the table in FIG. 4 depicts numbers being represented in a four data bit code, in other embodiments, different number of data bits, allowing different numbers to be represented, may be employed.

Figure 5:
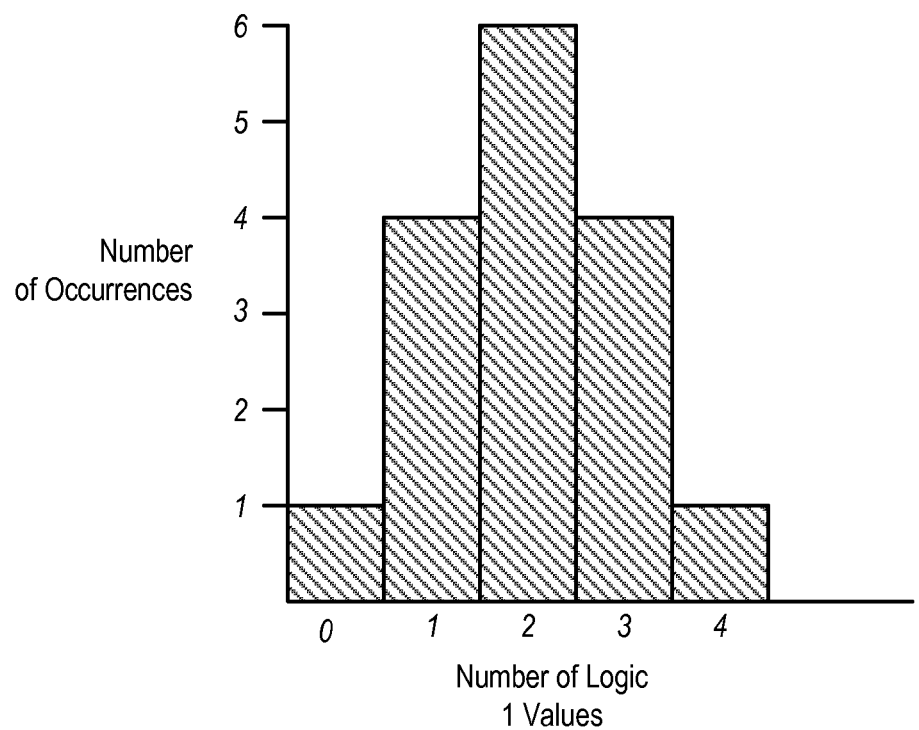
FIG. 5 illustrates a chart depicting a distribution of the number of logic 1 values within a set of logic code words.

The number of logic 1 values within the various code words that span a given data bit width vary. Turning to FIG. 5, a bar graph showing the distribution of the L-code words depicted in the table of FIG. 4 is illustrated. In the illustrated graph, the number of L-code words that contain a given number of logic 1 values (ranging from 0 to 4) is depicted. For example, there is exactly one L-code word, namely the L-code word "0000" that has no logic 1 values, and there is exactly one L-code word, namely the L-code word "1111" that has four logic 1 values. The rest of the L-code words contain either one, two, or three logic 1 values.

In the illustrated graph, the code words with two logic 1 values are the most prevalent, followed by code words with one or three logic 1 values. It is noted that the number of occurrences of code words with each given number of logic 1 values form the sequence "1 4 6 4 1." This sequence of numbers may, in various embodiments, correspond with the coefficients of a binomial expansion of order four. In general, for varying data bit widths, the number of code words with a given number of logic 1 values may be determined using the binomial expansion. For example, if code words using 5 data bits were to be transmitted, then, according to the binomial expansion, there would be one code word with no logic 1 values, five code words with one logic 1 value, 10 code words with five logic 1 values, and so forth. As described above, code words with an equal number of logic 1 values and logic 0 values may not generate SSO noise, and that for a given data bit width, code words contain fifty percent (or close to fifty percent) logic 1 values are the most frequently occurring. As described below in more detail, in some embodiments, only code words that have close to fifty percent logic 1 values may be used for transmission.

It is noted that the graph illustrated in FIG. 5 is merely an example. In other embodiments, different data bit widths of code words may result in different numbers of occurrences of code words with a given number of logic 1 values.

Figure 6:
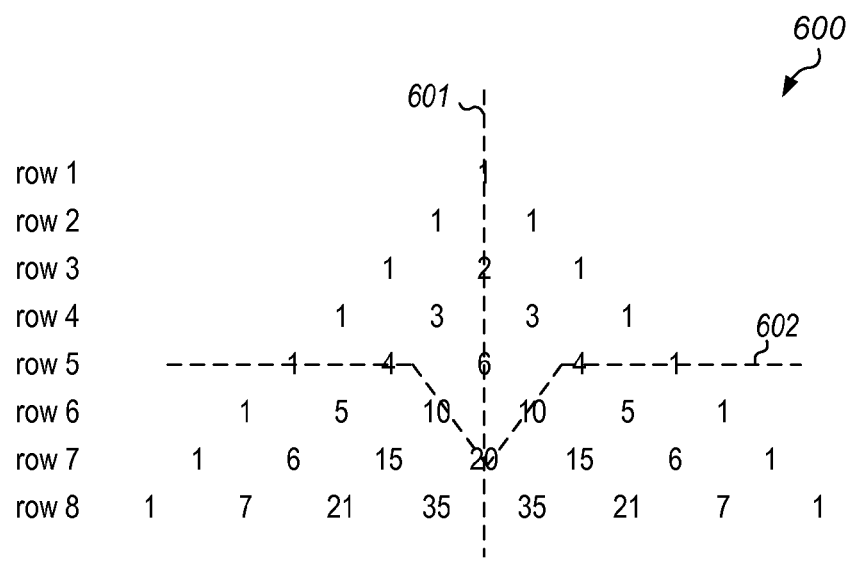
FIG. 6 illustrates an example of Pascal's Triangle.

A particular depiction of the binomial expansion is illustrated in FIG. 6. In the illustrated diagram, coefficients from various binomial expansions are arranged in rows to generate what is commonly referred to as "Pascal's Triangle." Since Pascal's Triangle graphically demonstrates the relationship between the number of symbols within a given number of logic 1 values for different data bit widths, in some embodiments, Pascal's Triangle may be used as a map to translate code words from one code space to another code space that has symbols that generate less SSO.

In the illustrated chart, line 601 indicates code words that have fifty percent logic 1 values. For example, in row 7, Pascal's Triangle indicates that there are 20 symbols that have fifty percent logic 1 values. In embodiments, where only symbols from the aforementioned group of 20 symbols are used in transmission, there may be no SSO generated noise.

Line 602, in the chart illustrated in FIG. 6, depicts an embodiment of how Pascal's Triangle may be employed to translate code words from one code space to another. Row 5 of the Pascal's Triangle depicted in FIG. 6 may correspond to a code space of four bit data words that includes 16 unique symbols. Line 602 indicates that by adding two more bits (which requires two additional wires for transmission between integrated circuits such as device 201 and device 202 as illustrated in FIG. 2) the 16 unique symbols of the four bit data word space may be all mapped onto the 20 silent symbols of a six bit data word space prior to transmission. When the mapped symbols are transmitted, no SSO noise may be generated. In general, any set of L-code symbols may be mapped onto a set of S-code symbols that has a higher cardinality than the set of L-code symbols.

In other embodiments, other mappings may be chosen that do not require, as many additional wires. For example, in the case of the four bit data word space, with one additional wire (which corresponds to row 6 of Pascal's Triangle), the symbols may be mapped into a combination of the 10 symbols that contain 2 logic 1 values and the 10 symbols that contain 3 logic 1 values that are part of the five bit data word code space. Such combinations of symbols may result in "quiet" transmission, i.e., transmission that is not silent, but less noisy than transmission of data that is not encoded.

It is noted that the version of Pascal's Triangle illustrated in FIG. 6 is merely an example. In other embodiments, other code mappings are possible and contemplated.

Figure 7:
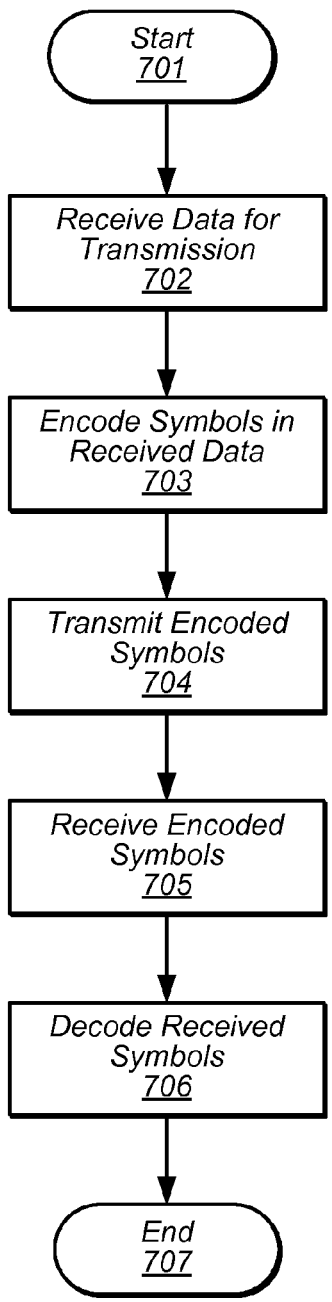
FIG. 7 illustrates a method of operating encoding and transmitting data in a computing system.

A flow diagram depicting a method of encoding data to reduce SSO noise is illustrated in FIG. 7. Referring collectively to computing system 200 as illustrated in FIG. 2, and the flowchart of FIG. 7, the method begins in block 701. Within device 201, encoder 203 may then receive data to be transmitted to device 202 (block 702). In some embodiments, the data received by encoder 203 may be from one or more functional blocks (not shown) within device 201. A functional block within device 201 may, in various embodiments, send data to encoder 203 to be transmitted, in response to a request from another device, such as, device 202, for example.

Encoder 203 may then examine each received signal and map, i.e., encode, to a new code space (block 703). In some embodiments, the new code space may be selected dependent upon a desired level of SSO noise. A code space containing silent symbols may, in some embodiments, be selected, while in other embodiments, a code space that requires less additional wires, i.e., a quiet code space, between the two devices may be selected. The data received by encoder 203 may, in various embodiments, be in a binary format, a Binary Coded Decimal (BCD), or any other suitable format. Encoder 203 may, in other embodiments, also encode the mapped word with an Error Correction Code (ECC), Cyclic Redundancy Check (CRC), or any other suitable error check code.

With the encoding of the data complete, encoder 203 may then send the encoded data to transmit circuits 204 and 205, which in turn, transmit the encoded data to device 202, via wires 206 and 207, respectively (block 704). Transmit circuits 204 and 205 may, in various embodiments, convert voltage levels of the encoded data before transmission. In other embodiments, transmit circuits 204 and 205 may adjust a bias level of the encoded data prior to transmission. Transmit circuits 204 and 205 may send data in accordance with one of various industry standard protocols, such as, PCI Express™, for example.

The transmitted data may then be received by receive circuits 208 and 209 of device 202 (block 705). In some embodiments, receive circuits 208 and 209 may convert the voltage levels of the received data to be compatible with an operating voltage level of device 202. Receive circuits 208 and 209 may, in other embodiments, adjust a bias level adjustment to match the data by transmit circuits 204 and 205.

Once the transmitted data has been received by receive circuits 208 and 209, the received data may then be sent to decoder 210, where it is converted back into its original encoding format (block 706). In some embodiments, decoder 210 may also correct any errors resulting from the transmission of the data using an ECC data word that may have been sent along with the encoded data. Decoder 210 may, in various embodiments, employ a general-purpose processor, look-up table (LUT), or any other suitable circuit for the purposes decoding the encoded data. The decoded data may then be sent to one or more functional blocks (not shown) within device 202, at which point the method concludes in block 707. In some embodiments, transmitting data from one device to another using the method depicted in the flowchart of FIG. 7 may result in reduced SSO noise.

It is noted that the method illustrated in FIG. 7 is merely an example. In other embodiments, different operations or different orders of operations are possible.

Modifying Encoding Schemes

Figure 8:
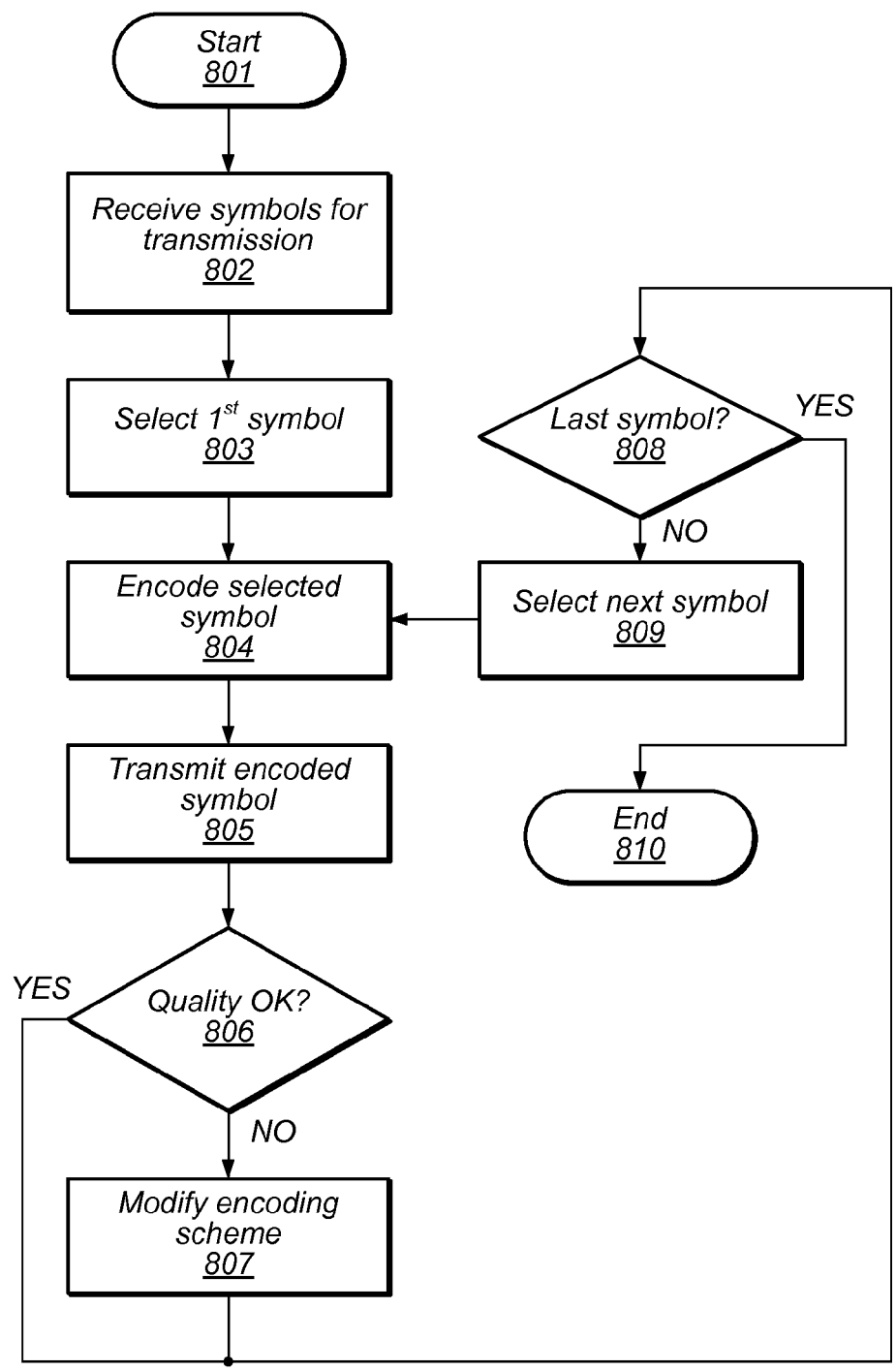
FIG. 8 illustrates a method for modifying a data encoding scheme during transmission of data in a computing system.

In some embodiments, changes in operating conditions, such as, e.g., temperature or voltage levels of power supplies, may result in different SSO noise levels. When such differences in SSO noise levels occur, the encoding of data symbols to be transmitted may be modified to accommodate the different noise levels. Turning to FIG. 8, an embodiment for modifying a data encoding scheme during transmission of data in a computing system is illustrated. Referring collectively to computing system 200 as illustrated in FIG. 2, and the flow diagram of FIG. 8, the method begins in block 801.

Encoder 203 may then receive data symbols to be encoded for transmission (block 802). In some embodiments, the data received by encoder 203 may be from one or more functional blocks (not shown) within device 201. A functional block within device 201 may, in various embodiments, send data to encoder 203 to be transmitted, in response to a request from another device, such as, device 202, for example.

A first symbol may then be selected from the received symbols for encoding and transmission (block 803). In some embodiments, the first symbol may be selected dependent upon the order in which the symbols were received. The first may, in other embodiments, be selected dependent upon any suitable metric. The selected symbol may then be encoded (block 804). In various embodiments, a number of data bit included in the encoded symbol may be greater than a number of data bits included in the selected symbol, and may correspond to one of possible symbols in a code space. In some embodiments, the code space may be selected dependent upon a desired level of SSO noise. A code space containing silent symbols may, in some embodiments, be selected, while in other embodiments, a code space that requires less additional wires, i.e., a quiet code space, between the two devices may be selected. Encoder 203 may, in various embodiments, further encode the selected symbol with CRC or other suitable error checking encoding scheme.

Encoder 203 may then send the encoded first symbol to transmit circuits 204 and 205, which in turn, transmit the encoded data to device 202, via wires 206 and 207, respectively (block 805). Transmit circuits 204 and 205 may, in various embodiments, convert voltage levels of the encoded data before transmission. In other embodiments, transmit circuits 204 and 205 may adjust a bias level of the encoded data prior to transmission. Transmit circuits 204 and 205 may send data in accordance with one of various industry standard protocols, such as, PCI Express™, for example.

The transmitted data may then be received by receive circuits 208 and 209 of device 202, and the method may then depend on a quality level of the transmission (block 806). In some embodiments, circuitry 214 may determine a quality level of the transmission of the encoded first symbol. The quality may, in various embodiments, be determined using a CRC, or other error code, encoded with the received symbol. In some embodiments, circuitry 214 may track the quality of levels of each receive symbol, and track a number of symbols whose quality was below a predetermined level.

If the quality of transmission is acceptable, then the method may depend on if the selected symbol is the last symbol (block 808). If the selected symbol is the last symbol of received symbols, then the method may conclude in block 801. If, however, the selected is symbol is not the last symbol of the received symbols, then encoder 203 may select a next symbol for encoding and transmission (block 809). The method may then continue as described above from block 804.

If the quality of transmission is not acceptable, then the encoding scheme employed by encoder 203 may be modified (block 807). In some embodiments, circuitry 214 may send information indicative of the quality level to device 201 through wire 215. Circuitry 214 may, in other embodiments, send the quality level information to device 201 using wires 206 and 207. Based on the quality level information received from circuitry 214, encoder 203 may select to encode a next symbol from the received symbols by mapping a selected symbol to a new code space. The new code space may employ more data bits, thereby allowing more silent or quiet codes. In some embodiments, circuitry 215 may transmit information indicative of the newly selected code space to device 202, thereby allowing device 202 to properly decode transmitted symbols encoded using the new code space. Once the encoding scheme has been modified, the method may continue from block 808 as described above.

It is noted that the embodiment illustrated in FIG. 8 is merely an example. In other embodiments, different operations and different orders of operations are possible and contemplated.

Figure 9:
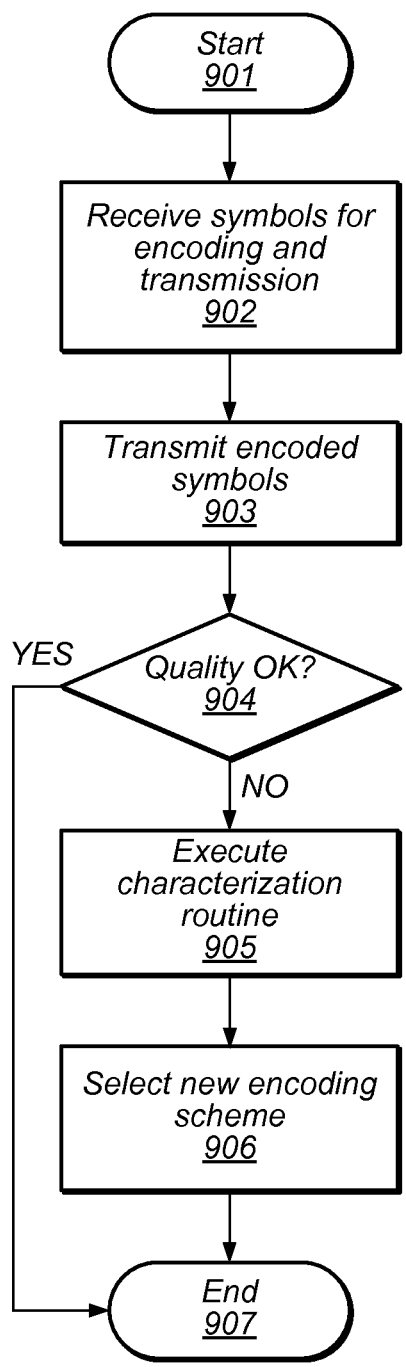
FIG. 9 illustrates another method for modifying a data encoding scheme during transmission of data in a computing system.

A flow diagram depicting another embodiment of a method for modifying an encoding used for transmitting data is illustrated in FIG. 9. Referring collectively to computing system 200 as illustrated in FIG. 2, and the flow diagram of FIG. 9, the method begins in block 901. As described above with regard to the methods described in FIG. 7 and FIG. 8, encoder 203 may receive and encode symbols to be transmitted (block 902), and the encoded symbols may then be transmitted (block 903).

The method may then depend on a quality level of the transmission (block 904). In various embodiments, each of the transmitted encoded symbols may include parity information. Such parity information may be used to determine if the transmitted encoded symbols were received correctly. Circuitry 214 may, in some embodiments, determine a number of transmitted encoded symbols that were received with errors, and compare the number to a predetermined number of allowed transmission errors to determine the quality level. If the quality level is acceptable, i.e., the number of transmission errors is less than the predetermined number, then the method may conclude in block 907.

Alternatively, if the quality is level is not acceptable, circuitry 213 may initiate a characterization routine (block 908). In some embodiments, circuitry 214 may send information indicative of the quality level to circuitry 213 via wire 215. Circuitry 213 may, in turn, initiate the characterization routine. As described below, in regard to FIG. 10, circuitry 213 may provide test data to encoder 203 to be encoded and transmitted to device 202 using various encoding schemes. In some embodiments, each different encoding scheme may map test symbols to corresponding symbols in different code spaces. Each code space may employ a different number of data bits to provide various numbers of silent or quiet code symbols.

Based on data received from circuitry 214 regarding the quality of transmission of the test symbols encoded with various encoded schemes, a new encoding scheme may then be selected (block 906). Circuitry 213 may, in response to selecting a new encoding scheme, send information indicating which encoding scheme was selected to circuitry 214 via wire 215. The method may then conclude in block 907. In some embodiments, the characterization routine and encoding selection process may be repeated each time a quality level exceeds a predetermined limit during the transmission of encoded data symbols.

Although the operations included in the embodiment of the method illustrated in the flow diagram of FIG. 9 are depicted as being performed in a serial fashion, in other embodiments, one or more of the operations may be performed in parallel.

Figure 10:
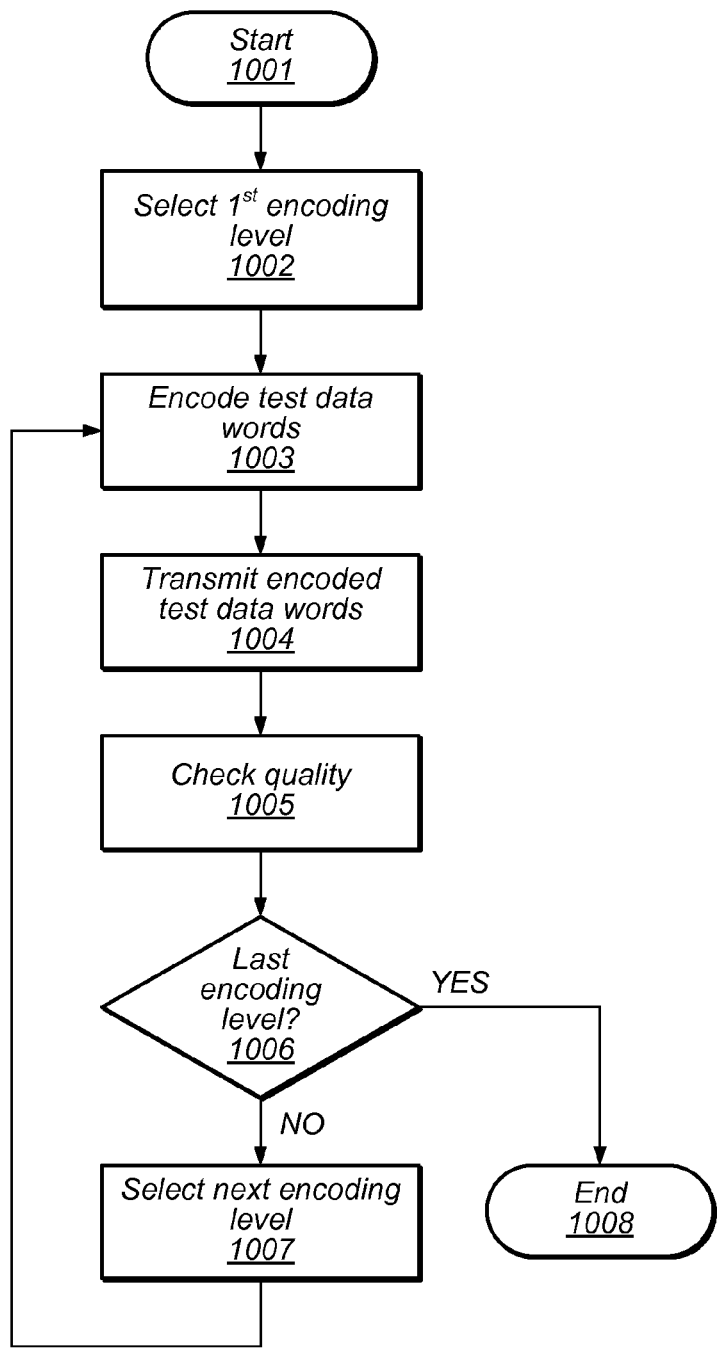
FIG. 10 illustrates a method for characterizing and selecting a data encoding scheme for transmission of data in a computing system.

Turning to FIG. 10, a flow diagram depicting performing a characterization routine on a data bus is illustrated. In various embodiments, the method illustrated in the flow diagram of FIG. 10 may correspond to block 906 of the method depicted in FIG. 9. Referring collectively to computing system 200 as illustrated in FIG. 2, and the flow diagram of FIG. 10, the method begins in block 1001.

A first encoding level may then be selected (block 1002). In various embodiments, the selected encoding scheme may map data symbols to a particular code space. The selected code space may exclusively contain silent symbols while, in some embodiments, the code space may include both silent and quiet code symbols. The first encoding level may be selected, in various embodiments, based on initial test data and/or characterization of communication between devices 201 and 202.

One or more test data words may then be encoded using the selected encoding level (block 1003). Encoder 203 may, in various embodiments, may map each test data word to a corresponding word in the code space specified by the selected encoding level. In some embodiments, encoder 203 may also encode each mapped test data word with an Error Correction Code (ECC), Cyclic Redundancy Check (CRC), or any other suitable error check code. Circuitry 213 may, in various embodiments, be configured to generate the test data words. The test data words may include one or more proper subsets of test data words, where test data words included in each proper subset may include different numbers of data bits. As used and described herein, a proper subset is a subset of set that does not equal the set. In other embodiments, a look-up table or other suitable storage circuit may store the test data words and send the test data words to encoder 203 in response to start of the characterization process.

The encoded test data words may then be transmitted to device 202 via wires 206 and 207 (block 1004). As each test data word is received by transceivers 208 and 209, circuitry 214 may determine the quality of the transmission (block 1005). In some embodiments, circuitry 214 may use a check error code encoded within each transmitted encoded test data word to determine if a given encoded test data word was transmitted correctly. Circuitry 214 may track a number of errors received during the transmission of all of the encoded test data words. The total number of errors may then be compared to a predetermined threshold value to generate a quality level. The quality level may then be sent to circuitry 213 via wire 215.

The method may then depend on if the current encoding level is the last encoding level (block 1006). If the current encoding level is the last available encoding level, then the method may conclude in block 1008. Alternatively, if the current encoding level is not the last available encoding level, then a new encoding level is selected (block 1007). The method may then continue as described above from block 1003. In some embodiments, circuitry 213 may resend the test data words to encoder 203 along with instructions to encode the test data words with the next level of encoding. The next level of encoding may, in some embodiments, include more silent symbols, and may employ additional wires between devices 201 and 202 to transmit the encoded test data words. Information indicative of a quality level of transmitted test data encoded with each encoding level may be saved and used to determine an encoding level to use for regular data transmission as described above in regard to block 906 as depicted in FIG. 9.

It is noted that the embodiment illustrated in FIG. 10 is merely an example. In other embodiments, different operations and different orders of operations may be employed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
an encoder unit configured to:
 receive a plurality of data words, wherein each data word of the plurality of data words includes N data bits, wherein N is a positive integer greater than one; and
 encode a first data word of the plurality of data words to generate a first encoded data word, wherein the first encoded data word includes M data bits, wherein M is a positive integer greater than N; and
a plurality of transceiver units configured to transmit a plurality of data bits in parallel;
wherein a first subset of the plurality of transceiver units is configured to transmit, in parallel, the M data bits of the first encoded data word, wherein a given transceiver unit of the first subset of the plurality of transceiver units is configured to transmit a corresponding one data bit of the M data bits of the first encoded data word; and
wherein the encoder unit is further configured to:
 receive information indicative of a quality level of a transmission of the first encoded data word; and
 encode a second data word of the plurality of data words to generate a second encoded data word that is based on the information, wherein the second encoded data word includes P data bits, wherein P is a positive integer greater than N and different than M; and
wherein a second subset of the plurality of transceiver units, different from the first subset of the plurality of transceiver units, is configured to transmit, in parallel, the P data bits of the second encoded data word, wherein a given transceiver unit of the second subset of the plurality of transceiver units is configured to transmit a corresponding one data bit of the P data bits of the second encoded data word.

2. The apparatus of claim 1, wherein the encoder unit is further configured to select a value of P that is less than M in response to a determination that the quality level of the transmission of the first encoded data word is greater than a predetermined level.

3. The apparatus of claim 1, wherein the encoder unit is further configured to select a value of P that is greater than M in response to a determination that the quality level of the transmission of the first encoded data word is less than a predetermined level.

4. The apparatus of claim 1, wherein the information indicative of the quality level of the transmission of the first encoded data word includes a number of times the first encoded data word is transmitted.

5. The apparatus of claim 1, wherein the information indicative of the quality level of the transmission of the first encoded data word includes an error detection rate.

6. The apparatus of claim 1, wherein the information indicative of the quality level of the transmission of the first encoded data word includes a plurality of data samples of the first encoded data word, wherein each data sample of the first encoded data word was performed at a respective one of a plurality of sample times.

7. The apparatus of claim 1, further comprising a test circuit, wherein the test circuit is configured to generate a plurality of test data words, wherein each test data word of a first proper subset of the plurality of test data words includes N data bits, and wherein each test data word of a second proper subset of the plurality of test data words includes M data bits.

8. A method, comprising:
receiving data to be transmitted, wherein the data includes a first plurality of symbols, and wherein each symbol of the first plurality of symbols includes N data bits, wherein N is a positive integer greater than one;
encoding a first symbol of the first plurality of symbols to generate a first encoded symbol, wherein the first encoded symbol includes M data bits, wherein M is a positive integer greater than N;
transmitting, via a communication bus and in parallel, each data bit of the M data bits of the first encoded symbol, by a respective transceiver unit of a first subset of a plurality of transceiver units;
monitoring a quality level of a transmission of at least the first encoded symbol;
encoding a second symbol of the first plurality of symbols to generate a second encoded symbol based on the quality level, wherein the second encoded symbol includes P data bits, wherein P is a positive integer greater than N and different than M; and
transmitting, via the communication bus and in parallel, each data bit of the P data bits of the second encoded symbol by a respective transceiver unit of a second subset of the plurality of transceiver units, different than the first subset of the plurality of transceiver units.

9. The method of claim 8, further comprising selecting a value of P that is less than M in response to determining that the quality level of the transmission of the second encoded symbol is greater than a predetermined level.

10. The method of claim 8, further comprising selecting a value of P that is greater than M response to determining that the quality level of the transmission of the second encoded symbol is less than a predetermined level.

11. The method of claim 8, wherein monitoring the quality level of the transmission of the first encoded symbol comprises tracking a number of times the first encoded symbol is transmitted.

12. The method of claim 8, wherein monitoring the quality level of the transmission of the first encoded symbol comprises monitoring a cyclic redundancy check (CRC) error detection rate.

13. The method of claim 8, further comprising sending a test data pattern, wherein the test data pattern includes a plurality of test symbols, wherein each test symbol of a first proper subset of the plurality of test symbols includes N data bits, and wherein each test symbol of a second proper subset of the plurality of test symbols includes M data bits.

14. A system, comprising:
a first functional block including a plurality of transceiver units, wherein the first functional block is configured to:
generate a plurality of data words, wherein each data word of the plurality of data words include N data bits, wherein N is a positive integer greater than one;
encode a first data word of the plurality of data words to generate a first encoded data word, wherein the first encoded data word includes M data bits, wherein M is a positive integer greater than N;
send, via a communication bus and in parallel, each data bit the M data bits of the first encoded data word using a respective transceiver unit of a first subset of a plurality of transceiver units; and
a second functional block configured to:
receive the first encoded data word;
monitor a quality level of the communication bus; and
send information indicative of the quality level of the communication bus to the first functional block; and
wherein the first functional block is further configured to:
encode a second data word of the plurality of data words to generate a second encoded data word that is based on the information, wherein the second encoded data word includes P data bits, wherein P is a positive integer greater than N and different than M; and
send, via the communication bus and in parallel, each data bit of the P data bits of the second encoded data work using a respective transceiver unit of a second subset of the plurality of transceiver units different than the first subset.

15. The system of claim 14, wherein the first functional block is further configured to select a value of P that is less than M in response to a determination that the quality level of the communication bus is greater than a predetermined level.

16. The system of claim 14, wherein the first functional block is further configured to select a value of P that is greater than M in response to a determination that the quality level of the communication bus is less than a predetermined level.

17. The system of claim 14, wherein to monitor the quality level of the communication bus, the second functional block is further configured to track a number of times a given encoded data word is sent by the first functional block.

18. The system of claim 14, wherein to monitor the quality level of the communication bus, the second functional block is further configured to monitor a cyclic redundancy check (CRC) error detection rate for encoded data words transmitted via the communication bus.

19. The system of claim 14, wherein to monitor the quality level of the communication bus, the second functional block is further configured to sample a given data bit of the M data bits of the first encoded data word at a plurality of sample points.

20. The system of claim 14, wherein the first functional block is further configured to send a test data pattern, wherein the test data pattern includes a plurality of test data words, wherein each test data word of a first proper subset of the plurality of test data words includes N data bits, and wherein each test data word of a second proper subset of the plurality of test data words includes M data bits.

* * * * *

UNITED STATES PATENT AND TRADEMARK OFFICE
CERTIFICATE OF CORRECTION

PATENT NO. : 9,632,883 B2
APPLICATION NO. : 14/563485
DATED : April 25, 2017
INVENTOR(S) : Masleid et al.

Page 1 of 1

It is certified that error appears in the above-identified patent and that said Letters Patent is hereby corrected as shown below:

In the Claims

In Column 15, Line 41, in Claim 10, delete "M response" and insert -- M in response --.

In Column 16, Line 26, in Claim 14, delete "work" and insert -- word --, therefor.

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*